United States Patent [19]

Belli et al.

[11] Patent Number: 5,147,521

[45] Date of Patent: Sep. 15, 1992

[54] QUICK CHANGE SPUTTER TARGET ASSEMBLY

[75] Inventors: Robert L. Belli, Columbus; Martin L. Blazic, Bexley; Rick O. Eller, Orient; Kenneth B. Fielder, Circleville; Conrad E. Fuchs, Grove City, all of Ohio

[73] Assignee: Tosoh SMD, Inc., Grove City, Ohio

[21] Appl. No.: 702,885

[22] Filed: May 20, 1991

[51] Int. Cl.⁵ ............................................. C23C 14/34
[52] U.S. Cl. .......................... 204/298.12; 204/298.18
[58] Field of Search .................... 204/298.09, 298.12, 204/298.18

[56] References Cited

U.S. PATENT DOCUMENTS

| | | | |
|---|---|---|---|
| 4,100,055 | 7/1978 | Rainey | 204/298 |
| 4,385,979 | 5/1983 | Pierce et al. | 204/298 |
| 4,457,825 | 7/1984 | Lamont, Jr. | 204/298 |
| 4,657,654 | 4/1987 | Mintz | 204/298 |
| 4,820,397 | 4/1989 | Fielder et al. | 204/298 |

Primary Examiner—Nam Nguyen
Attorney, Agent, or Firm—Biebel & French

[57] ABSTRACT

A sputtering target assembly is disclosed having a sputtering gun with an inner and outer annular wall, where the inner annular wall has a plurality of radially projecting set screws, threadably movable within threaded apertures in the inner annular wall. A mounting ring is profiled to fit over the inner annular wall, the mounting ring having a recessed grove, into which the set screws are received, to secure the mounting ring. The mounting ring includes a plurality of radially disposed spring plungers which are threadably installed in threaded apertures in the mounting ring. The target has a grooved inner annular surface for receiving the spring ball plungers, whereby the target is retained to the sputtering gun.

5 Claims, 4 Drawing Sheets

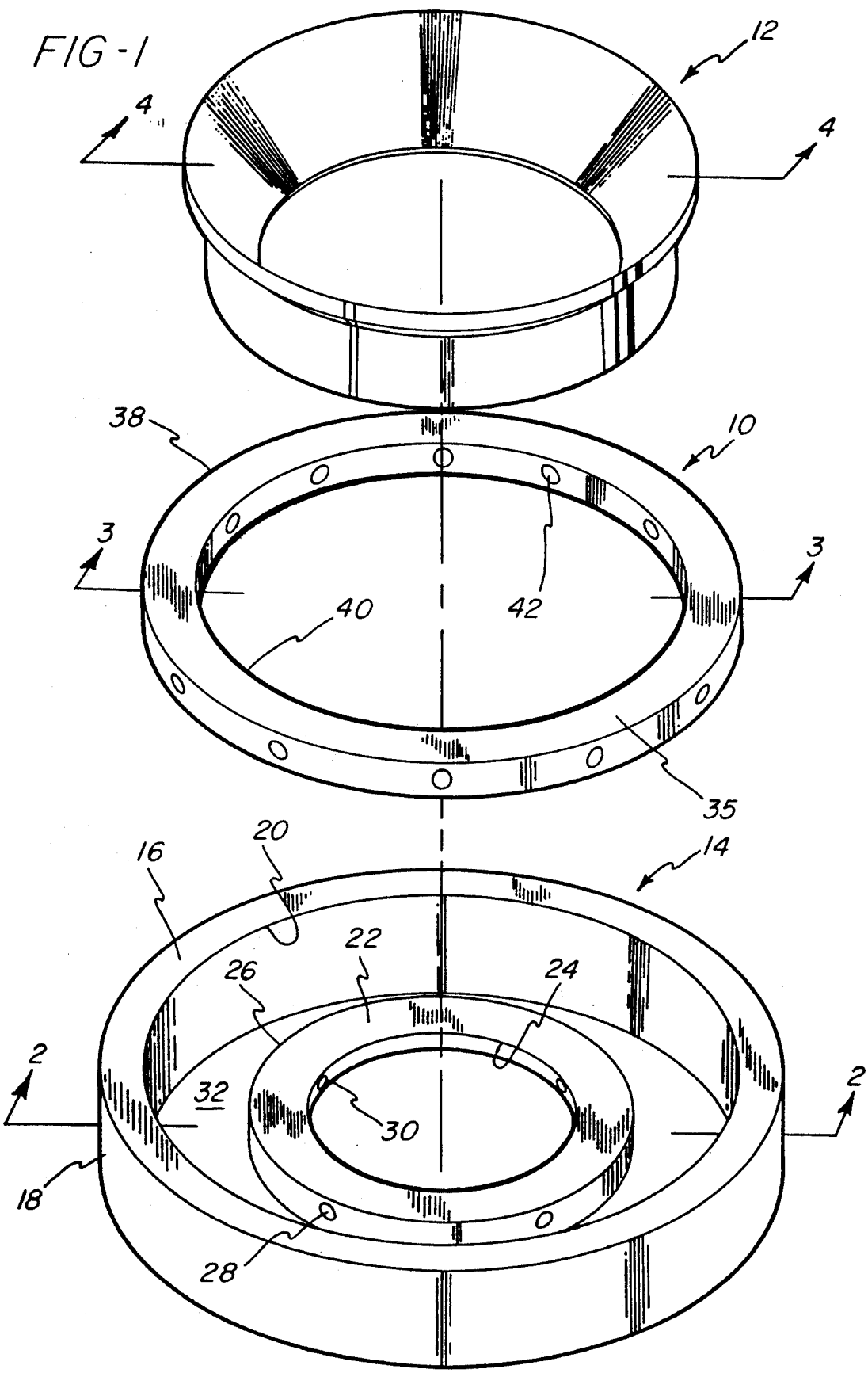

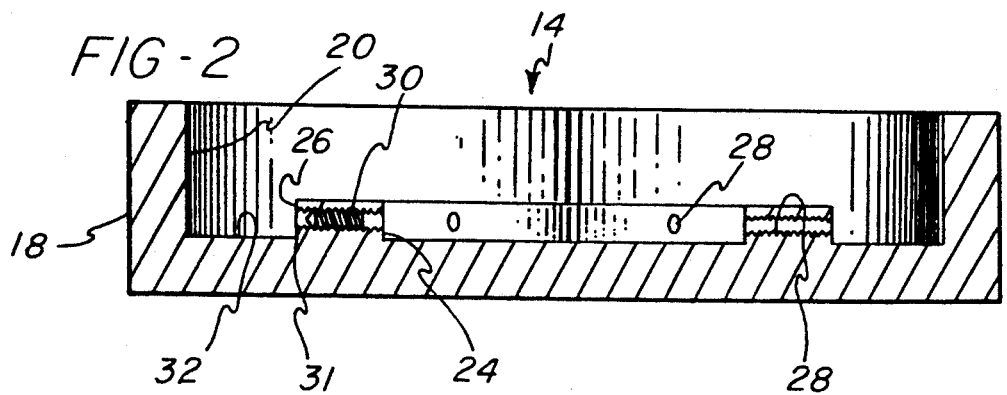
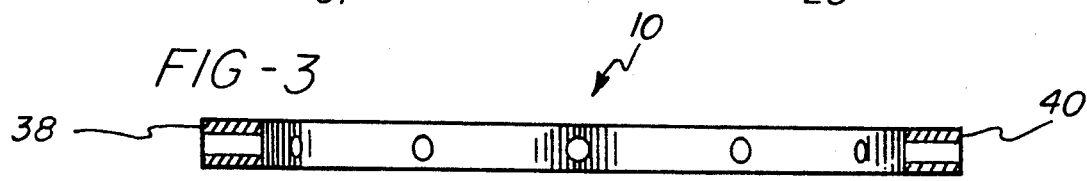
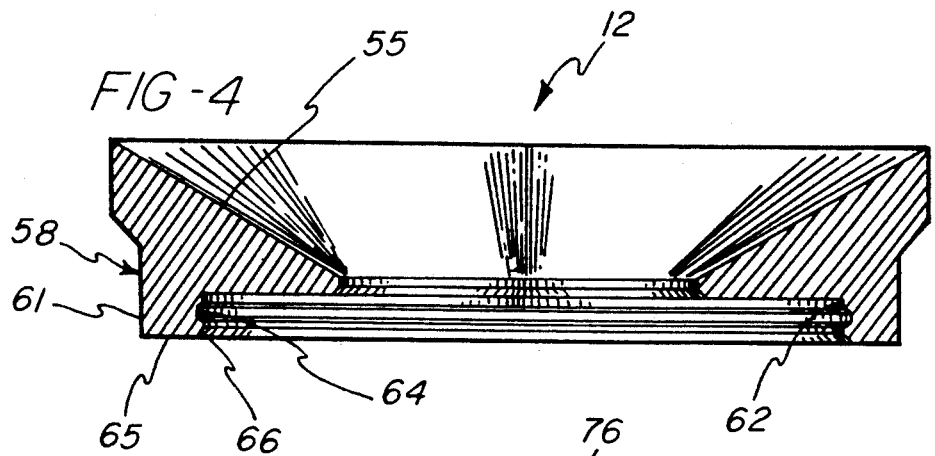
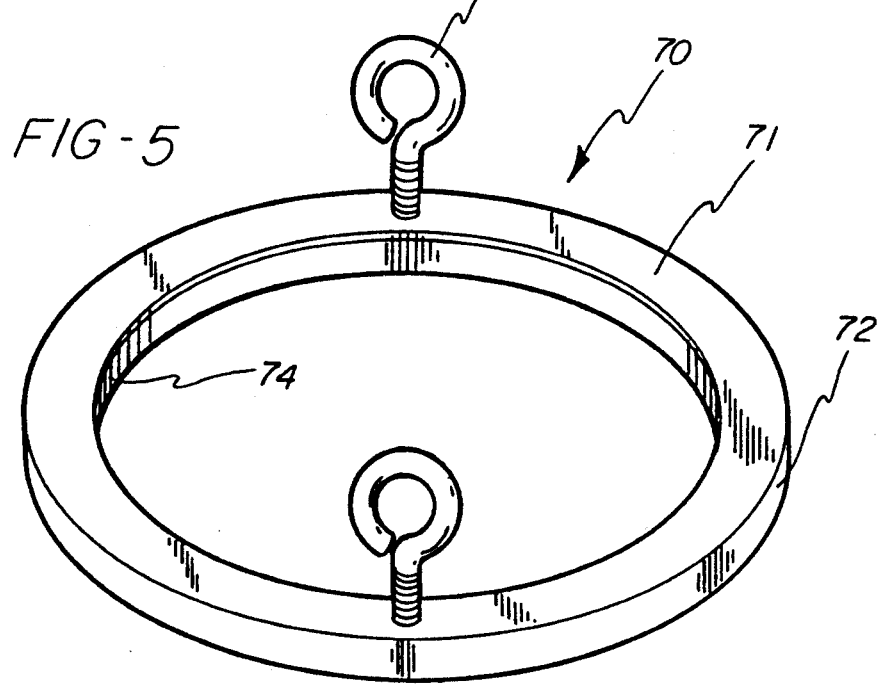

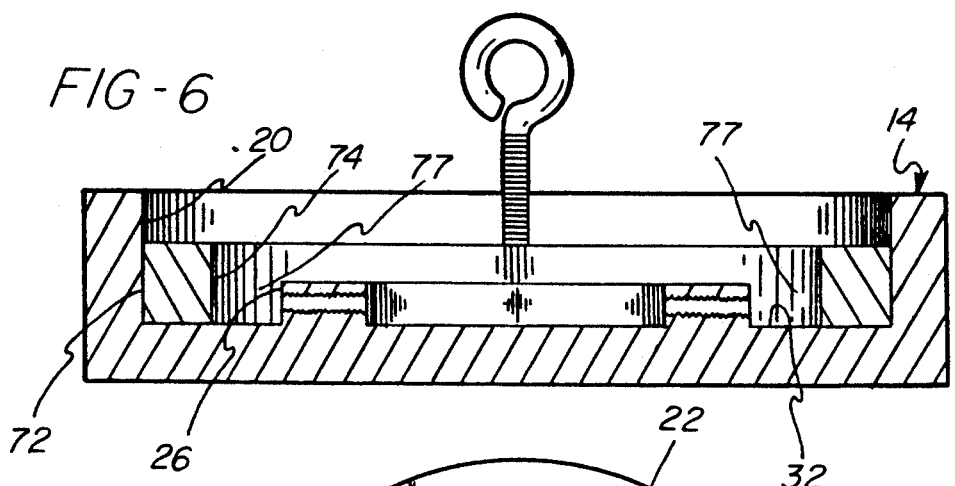
FIG-6
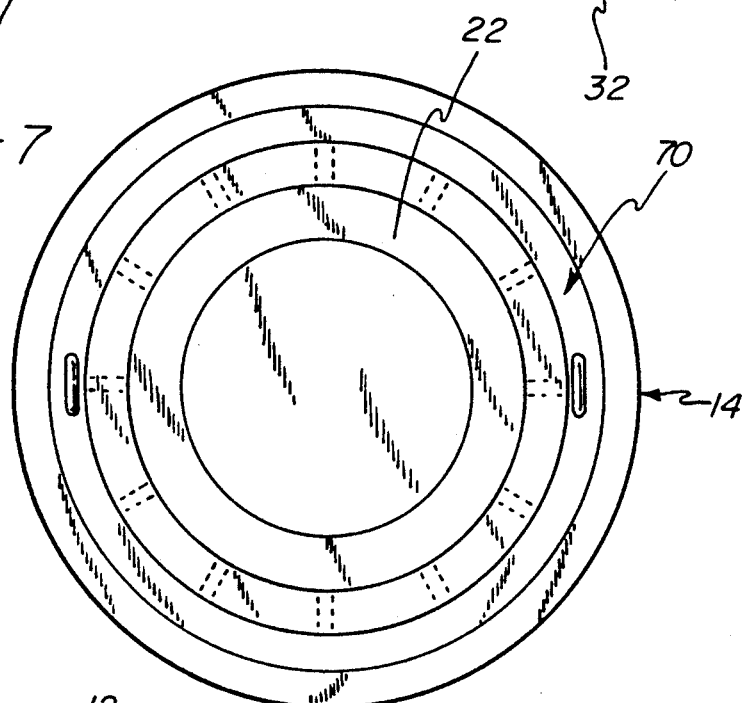
FIG-7
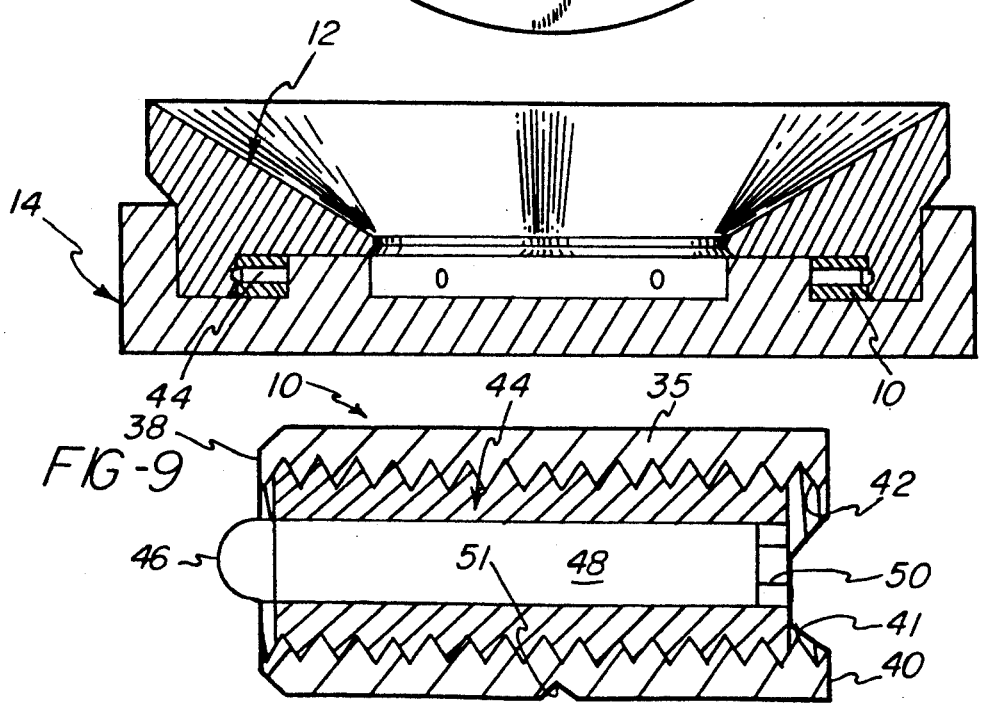
FIG-8
FIG-9

QUICK CHANGE SPUTTER TARGET ASSEMBLY

BACKGROUND OF THE INVENTION

1. Field of the Invention

The subject invention relates to a mounting ring for quickly mounting annular targets to their corresponding sputtering sources.

2. Description of the Prior Art

Sputtering, as a means to deposit thin films of a desired material on a substrate, is a relatively old art which has become very important in the manufacture of semiconductor devices such as integrated circuits. In a sputtering system, material to be deposited on the substrate is removed from a sputter target by bombardment of the target with ions. However, ion bombardment not only causes atoms or molecules of the target material to be ejected from the target, it also imparts thermal energy to the target.

Normally, a sputtering system comprises a sputter source, a vacuum chamber, and means for positioning and holding the substrate in proximity to the sputter source. A modern sputter source normally comprises a target from which material is to be sputtered, means for holding the target in place, means for creating a plasma in the vicinity of the target, means for causing ions in the plasma to bombard the target, and means for cooling the target to prevent overheating.

Various means have been used in the past for holding sputter targets in place in sputter sources. Such holding means must ensure that the target maintains good thermal contact with the cooling means. In a vacuum environment this generally requires good physical contact. On the other hand, sputter targets must be replaced from time to time as the target material is removed and the target is eroded away. Moreover, in certain research applications there is the need for frequent target changes so that experiments can proceed with different materials.

The time required to replace a sputter target and the method of replacement are often significant considerations to users of sputtering systems. The semiconductor manufacturing industry is particularly sensitive to equipment "down-time", (i.e., the time a piece of production equipment is unavailable) because of the disruptive and costly effects it can have on an entire semiconductor fabrication line. Similarly, the method of target replacement should minimize the introduction of foreign material into the sputtering system's vacuum chamber to avoid possible contamination problems with the substrate.

In some prior art sputter sources, particularly in sputter sources designed to use planar targets, the sputter target is physically soldered to a cooling plate. While this ensures good thermal contact, it makes replacement of the target a difficult and time-consuming problem. In other designs, targets are physically bolted to a cooling means. While this makes target replacement somewhat easier, the thermal contact is not as good. There is a class of sputter sources having annular targets in which target cooling is accomplished by thermal contact between an outer rim of the target and a peripheral cooling wall. In such sources, good thermal contact is maintained between the target rim and the cooling wall by thermal expansion of the target. Examples of such sources are shown in U.S. Pat. Nos. 4,100,055; 4,385,979; 4,457,825 and 4,657,654. When a sputter source of this type is at ambient temperature, the target is slightly smaller in diameter than the cooling wall, and the target moves freely in an axial direction. This makes target replacement much easier than in the types of sputter sources described in the preceding paragraph. However, when the source is in operation and heats, the target expands into good physical and thermal contact with the cooling wall.

For the variety of reasons, sputter sources are often operated in a vertical or inverted orientation. To operate in such postures, sputter sources which rely on target expansion to provide good physical contact with a cooling wall require an additional holding means to maintain the sputter target in its proper position when the source is at ambient temperature. In the past, the additional holding means utilized have involved structures which must be screwed and unscrewed each time a target is changed. These prior art structures make sputter target changing a longer, more complex process than is desired.

One prior art solution to address the length of time it takes to change targets is shown in U.S. Pat. No. 4,657,654 in which the additional target holding means comprises pins, mounted at the outer rim of the target, which cooperate with holding slots. One disadvantage of this approach is the fact that target fabrication becomes more expensive and complex due to the need to securely mount the pins, which are made of a different material than the sputter target, into the target material. The pin mounting must remain secure notwithstanding repeated temperature cycling of the system.

U.S. Pat. No. 4,820,397 also shows an apparatus for mounting a target to a sputtering source. This design includes a plurality of stamped and formed springs held to the mounting ring by screws. Each of the stamped and formed springs includes a protrusion which cooperates with an inwardly directed groove in the target to maintain the target in place. While the design is theoretically sound, the springs are expensive to manufacture, and can be labor intensive to install.

Accordingly, it is an object of this invention to make it possible to quickly and easily change sputter targets in a sputter source of the type which relies on thermal expansion of an annular sputter target to provide physical contact with a peripheral cooling wall.

Yet another object of this invention is to provide a quick change target and source structure which can be easily retrofitted into existing sputtering systems.

Still another object of this invention is to provide a quick change target structure which can be used in a sputter source of the type described in U.S. Pat. No. 4,457,825.

Another object of the invention is to provide a quick change target assembly as previously mentioned, which is cost efficient, and which is easily assembled.

SUMMARY OF THE INVENTION

The present invention is directed to a sputter source of the type having a quick change target from which material is sputtered. The invention comprises a sputtering gun having inner and outer annular walls, where the inner wall has locking means extending radially outwardly from the inner annular wall. An annular alignment ring is adapted for slidable receipt over the inner annular wall, the annular alignment ring having a plurality of discrete spring plunger means disposed in a radial array around the ring, the annular alignment ring having an outer peripheral surface spaced from an inner peripheral surface on the outer annular wall, thereby forming an annular gap. A removable annular shaped target has a lower annular wall adapted for receipt within the annular gap, the target being retained in position in the sputtering gun by the discrete spring plunger means.

BRIEF DESCRIPTION OF THE DRAWINGS

FIG. 1 is an isometric view of the sputtering gun and target assembly, showing the various components exploded away from each other.

FIG. 2 is a cross-sectional view through lines 2—2 of FIG. 1.

FIG. 3 is a cross-sectional view through lines 3—3 of FIG. 1.

FIG. 4 is a cross-sectional view through lines 4—4 of FIG. 1.

FIG. 5 shows an alignment ring for use with assembling the target of the present invention.

FIG. 6 is a cross-sectional view similar to that of FIG. 2, showing the alignment ring in place.

FIG. 7 is an upper elevational view of the sputtering gun with the adapter ring and alignment ring in place.

FIG. 8 is a cross-sectional view similar to that of FIG. 2, showing the alignment ring removed and the target in position.

FIG. 9 is an enlarged cross-sectional view through the mounting ring, similar to that of FIG. 3.

DETAILED DESCRIPTION OF THE PREFERRED EMBODIMENT

Figure 10:
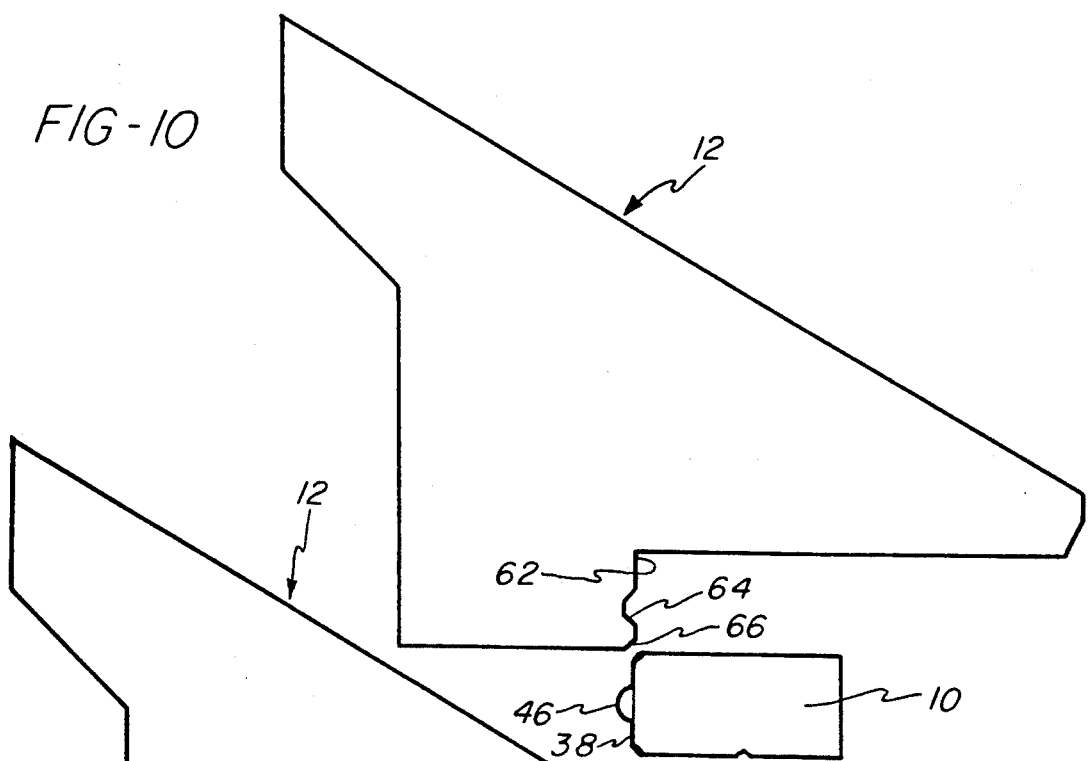
FIG. 10 is a diagrammatical view showing the target exploded from the mounting ring.

With reference first to FIG. 1, the present invention relates to an improved mounting ring 10 for mounting a target 12 to a source or sputtering gun 14. With reference to FIGS. 1 and 2, the sputtering gun will be described in greater detail.

The sputtering gun 14 includes an outer annular wall 16 having an outer peripheral surface 18, and an inner peripheral surface 20. The sputtering gun 14 further includes an inner annular wall 22 having an inner peripheral surface 24 and an outer peripheral surface 26, where the inner annular wall has a plurality of threaded apertures at 28, extending between the surfaces 24, 26, carrying set screws 30. As shown in FIG. 2, the set screws 30 have conical noses 31. The sputtering gun 14 further comprises a floor surface 32 extending between the peripheral surfaces 20 and 26.

With reference now to FIGS. 1 and 3, the adapter ring 10 includes an adapter body 35 having an outer peripheral surface 38 and an inner peripheral surface 40. The inner peripheral surface 40 has an annular groove 41 extending in a substantial V-shape, as shown in FIG. 9. It should be appreciated that the entire depth of the V-groove 41 is blocked from view in FIG. 9. With respect still to FIG. 9, the adapter ring body 35 has a plurality of threaded apertures 42 extending between the surfaces 38 and 40, where spring loaded plungers 44 are threadably inserted into the corresponding apertures 42.

In the preferred embodiment of the invention, the spring loaded plungers 44 are commercially available and are purchased from Vlier Engineering, located at 2333-T Valley Street, Burbank, Calif. 91505. The plungers 44 have a forward spring loaded ball 46 which can be moved into the barrel or tube 48 under spring load from a compression spring (not shown) within the tube. An aperture 50 is positioned at the rear of the tube 48 to exhaust gases from the sputtering process. The rear end of the plungers includes a slot for the engagement of a screw driver, such that the plungers can be threaded into the apertures 42.

The spring plungers 44 are threaded into corresponding apertures 42 until the spring loaded balls extend a distance from surface 38, at which time the lower surface of the ring body 35 is punched at 51, thereby preventing any movement of the plungers. In the preferred embodiment of the invention, the spring balls extend 0.050 inches from the wall 38.

With reference now to FIG. 4, the target 12 has a face 55 from which a desired material, such as aluminum, is sputtered to form a thin film on its substrate, such as a semi-conductor wafer. The target 12 has an outer rim 58 having an outer surface 61 and an inner surface 62, where the outer surface is profiled for positioning proximate to a cooling wall for cooling of the target. The inner surface 62 includes an inner retaining groove 64, which will be described in greater detail herein. The target 12 also includes a lower surface 65 in transition with a lead-in or chamfered edge 66.

To assemble the sputtering target 12 to the sputtering gun 14, an alignment ring 70 is shown in FIG. 5 having a ring body 71, where the ring body has an outer annular surface 72, an inner annular surface 74, and two lifting members, such as eye bolts shown as 76. The outer annular surface 72 of the alignment ring 70 is closely toleranced to match the inner diameter of the sputtering gun to lie closely adjacent to inner annular surface 20 as shown in FIG. 6. As installed, the alignment ring 70, together with the sputtering gun 14, leaves an annular gap 77 between surface 26 of the sputtering gun and surface 74 of the alignment ring, as shown in FIG. 6.

With the alignment ring so installed, the mounting ring 10 can be inserted in the previously mentioned annular gap 77, as the annular gap between surfaces 26 and 74 is profiled to accept the mounting ring 10 with the spring plungers in a preloaded condition against the inner annular surface 74 of the alignment ring 70. As previously mentioned with respect to FIG. 2, the sputtering gun carries a plurality of set screws at 30 and it should be appreciated that during the installation of the mounting ring 10 into the annular gap 77, the set screws 30 should be recessed from surface 26. With mounting ring 10 so installed, the set screws 30 can now be projected out to a position where the conical noses 31 engage the V-shaped peripheral groove 41 to maintain the mounting ring in a fixed position within the sputtering gun. As shown in FIG. 7, the sputtering gun 14 contains 6 set screws 30 whereas the mounting ring contains 12 spring plungers 44 and the mounting ring is positioned relative to the set screws 30 such that none of the set screws will engage the backside of the spring plungers.

With the set screws 30 now engaged in the peripheral groove 41 of the mounting ring 10, the alignment ring 70 is grasped by the eye bolts 76 and pulled outwardly. It should be appreciated that the thickness of the alignment ring, i.e., the distance between annular surfaces 72 and 74, is substantially the same as the thickness of the target rim 58, that is, the distance between surfaces 61 and 62 of the target 12. Thus, the alignment ring 70 centers the mounting ring 10, and ensures that there is adequate annular spacing between the surfaces 20, 38 to accept the rim 58 of the target. The target 12 is now inserted in the sputtering gun with the spring plungers engaged in peripheral groove 64 as shown in FIG. 8.

Figure 11:
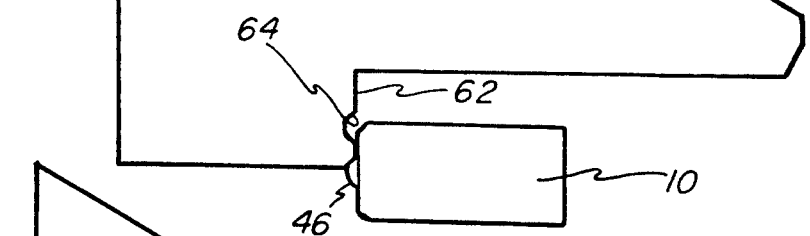
FIG. 11 is a diagrammatical view similar to FIG. 10 showing the spring ball slightly recessed in the spring plunger.
Figure 12:
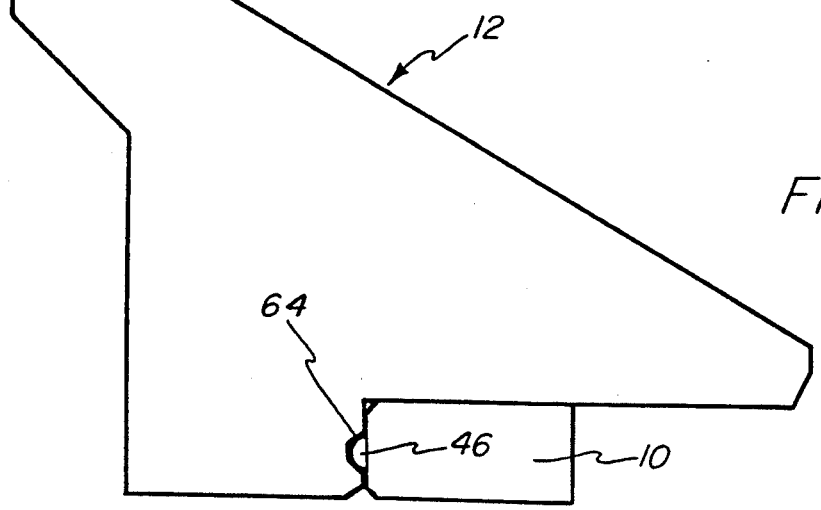
FIG. 12 is a diagrammatical view showing the target mounted to the mounting ring.

It should be appreciated that the diameter of surface 62 is sufficient to clear the outer surface 38 of the mounting ring 10, but that the inner diameter between opposing spring balls 46 is less than the inner diameter of inner surface 62. As shown in FIG. 10, the target 12 is positioned adjacent to the mounting ring with the inner diameter 62 of the target 12 aligned with the outer surface 38 of the mounting ring 10. Continued movement of the target 12 over the mounting ring 10, causes the spring ball 46 to be cammed rearwardly (to the right as viewed in FIG. 10) into the plunger 44 under the cam force of the lead-in surface 66, as shown in FIG. 11. Finally, the target is fully seated when the spring ball 46 is sprung back into the groove 64, as best shown in FIG. 12.

While the form of apparatus herein described constitute a preferred embodiment of this invention, it is to be understood that the invention is not limited to this precise form of apparatus, and that changes may be made therein without departing from the scope of the invention which is defined in the appended claims.

What is claimed is:

1. A sputtering source having a quick change target from which material is sputtered, comprising:
    a sputtering gun having inner and outer annular walls, where said inner wall has locking means extending radially outwardly therefrom;
    an annular mounting ring adapted for slidable receipt over said inner annular wall, said annular mounting ring having a plurality of spring loaded ball plungers disposed in a radial array around said ring, said annular mounting ring having an outer peripheral surface and an inner peripheral surface, said outer peripheral surface spaced from said outer annular wall, thereby forming an annular gap; and
    a removable annular shaped target from which material can be sputtered, said target having an inner rim having an inwardly facing groove, said spring loaded ball plungers being retractable into said mounting ring to receive said inner rim, and expandable into said inwardly facing groove for retaining said target to said sputtering gun,
    said annular mounting ring including a plurality of threaded bores, each threaded bore extending radially from said inner peripheral surface to said outer peripheral surface of said annular mounting ring, each of said spring loaded ball plungers housed within a threaded insert member threadably received in a corresponding threaded bore, whereby a radial disposition of each said threaded insert can be varied within its corresponding mating threaded bore.

2. The sputtering source of claim 1, wherein said annular mounting ring has a peripheral groove adapted for receipt of said locking means on said sputtering gun.

3. The sputtering source of claim 2, wherein said locking means comprises set screws, each having a conical leading end, whereby said leading ends can be threaded into engagement with said peripheral groove on said annular mounting ring.

4. The sputtering source of claim 1, wherein said inner rim of said target includes a lead-in edge located below said inwardly facing groove for camming said spring loaded ball plungers into said retracted position.

5. Sputter target for use in a sputtering source comprising a sputtering gun having inner and outer annular walls, an annular mounting ring having an outer peripheral surface and an inner peripheral surface with said inner peripheral surface adapted for sliding receipt over said inner annular wall of said gun, a plurality of spring loaded plungers disposed in an array around said annular mounting ring with said spring loaded plungers retractable from an extended position in which they protrude from said outer peripheral surface into a retracted position within said annular mounting ring, said target comprising a removable annularly shaped target from which material can be sputtered, said target further comprising an inner rim having an inwardly facing groove adapted for receipt of said spring loaded plungers therein to connect said target and said annular mounting ring, said inner rim further comprising a lead-in edge located below said inwardly facing groove for camming said spring loaded plungers into a retracted position.

* * * * *